(12) United States Patent
Mingant et al.

(10) Patent No.: US 8,849,598 B2
(45) Date of Patent: Sep. 30, 2014

(54) IN-SITU BATTERY DIAGNOSIS METHOD USING ELECTROCHEMICAL IMPEDANCE SPECTROSCOPY

(75) Inventors: Remy Mingant, Vienne (FR); Julien Bernard, Oullins (FR); Valérie Sauvant-Moynot, Lyons (FR)

(73) Assignee: IFP Energies Nouvelles, Rueil-Malmaison Cedex (FR)

( * ) Notice: Subject to any disclaimer, the term of this patent is extended or adjusted under 35 U.S.C. 154(b) by 364 days.

(21) Appl. No.: 13/240,519

(22) Filed: Sep. 22, 2011

(65) Prior Publication Data

US 2012/0078552 A1  Mar. 29, 2012

(30) Foreign Application Priority Data

Sep. 27, 2010 (FR) ..................................... 10 03820

(51) Int. Cl.
*G06F 19/00* (2011.01)
*G01R 31/36* (2006.01)

(52) U.S. Cl.
CPC ........ *G01R 31/3662* (2013.01); *G01R 31/3651* (2013.01)
USPC ............................... 702/63; 324/426; 702/85

(58) Field of Classification Search
CPC ........... G01R 31/3651; G01R 31/3662; G01R 31/3648; G01R 31/3679; G01R 31/3675; G01R 31/24; H01M 10/42
USPC .......... 702/30, 63, 64, 85, 181, 182; 320/132, 320/134; 324/426, 428, 430
See application file for complete search history.

(56) References Cited

U.S. PATENT DOCUMENTS

| | | | |
|---|---|---|---|
| 6,037,777 A | 3/2000 | Champlin | |
| 6,191,590 B1 | 2/2001 | Klütz et al. | |
| 6,778,913 B2 | 8/2004 | Tinnemeyer | |
| 7,593,821 B2 * | 9/2009 | Plett | 702/63 |
| 7,593,823 B2 * | 9/2009 | Iwane et al. | 702/63 |
| 2004/0006440 A1 | 1/2004 | Kim et al. | |
| 2007/0035307 A1 | 2/2007 | Schoch | |
| 2007/0090843 A1 | 4/2007 | De Doncker et al. | |
| 2009/0096459 A1 | 4/2009 | Yoneda et al. | |
| 2011/0208452 A1 | 8/2011 | Mingant et al. | |

FOREIGN PATENT DOCUMENTS

| | | |
|---|---|---|
| EP | 0 880 710 B1 | 8/2004 |
| EP | 1 835 297 A1 | 9/2007 |
| EP | 2 071 345 A1 | 6/2009 |
| FR | 2 874 701 | 8/2004 |
| FR | 10/00778 | 2/2010 |
| WO | WO 99/66340 | 12/1999 |
| WO | WO 03/071617 A2 | 8/2003 |
| WO | WO 2009/036444 A2 | 3/2009 |

OTHER PUBLICATIONS

Tröltzsch, Uwe, et al: Electrochimica Acta 51, 2006, pp. 1664-1672, entitled "Characterizing Aging Effects of Lithium IonBatteries by Impedance Spectroscopy".
Rodrigues, Shalini, et al: "A Review of State-of-Charge Indication of Batteries by Means of A.C. Impedance Measurements", Journal of Power Sources, Elsevier SA, CH, vol. 87, No. 1-2, Apr. 1, 2000, pp. 12-20, XP004194179, ISSN: 0378-7753, DOI: DOI: 10.1016/S0378-7753(99)00351-1.
Huet, F., et al: "A Review of Impedance Measurements for Determination of the State-of-Charge or State-of-Health of Secondary Batteries", Journal of Power Sources, Elsevier SA, CH, vol. 70, No. 1, Jan. 30, 1998, pp. 59-59, XP005907566, ISSN: 0378-7753, DOI: DOI: 10.1016/S0378-7753(97)02665-7.

* cited by examiner

*Primary Examiner* — John H Le
(74) *Attorney, Agent, or Firm* — Antonelli, Terry, Stout & Kraus, LLP.

(57) ABSTRACT

A method of estimating the internal state of a first electrochemical system for power storage is disclosed. The SoC and the electrochemical impedance are determined for different internal states of a second electrochemical system of a same type as the first electrochemical system being studied. An electrochemical impedance model is then defined as a function of the SoC and of parameters. The electrochemical impedance Z of the system studied is determined and its SoC is estimated using the model applied to electrochemical impedance Z.

34 Claims, 6 Drawing Sheets

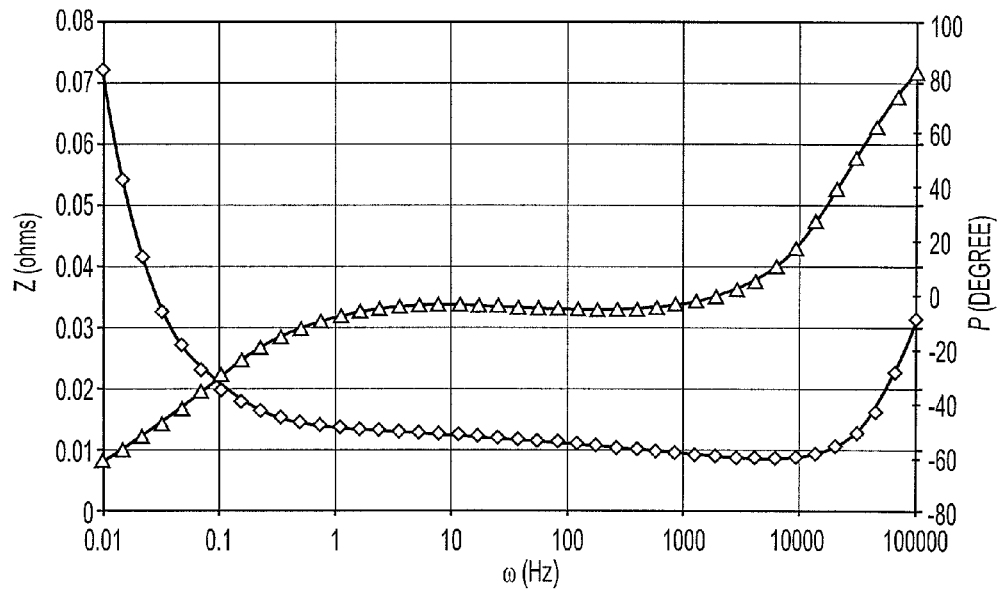
FIG. 7
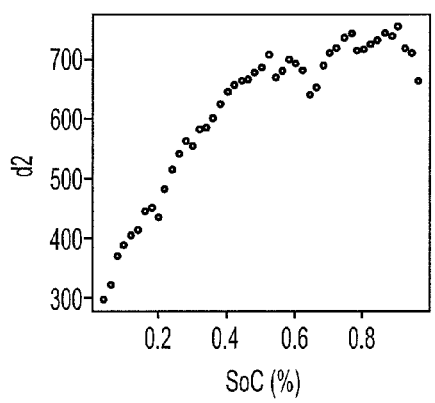 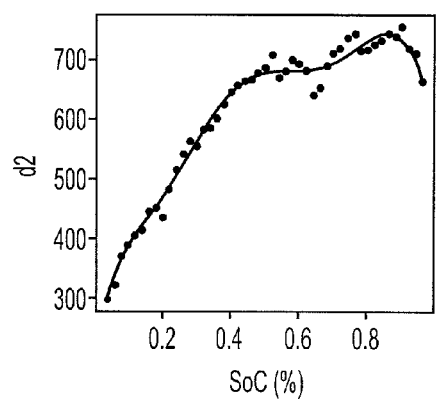
FIG. 8A          FIG. 8B

IN-SITU BATTERY DIAGNOSIS METHOD USING ELECTROCHEMICAL IMPEDANCE SPECTROSCOPY

CROSS REFERENCE TO RELATED APPLICATION

Reference is made to French application Ser. No. 10/03.820, filed Sep. 27, 2010, which application is incorporated herein by reference in its entirety.

BACKGROUND OF THE INVENTION

1. Field of the Invention

The present invention relates to a method of estimating the internal state of an electrochemical system for electrical power storage, such as a battery (lead, Ni-MH, Li-ion, etc.). The method allows management of batteries used in stationary or on-board applications, notably during the operation thereof.

2. Description of the Prior Art

The battery is one of the most critical components in the case of hybrid or electrical vehicle applications. Proper operation of these applications is based on a smart battery management system (BMS) whose purpose is to operate the battery with the best compromise between the various dynamic demand levels. The BMS requires precise and reliable knowledge of the state of charge (SoC) and of the state of health (SoH).

The SoC of a battery corresponds to its available capacity and it is expressed in percentage of its nominal capacity given by the manufacturer, or in percentage of its total capacity measured under given conditions when such measurement is possible. Knowing the SoC allows estimation of the time during which the battery can continue to supply power at a given current before the next recharge, or until when it can absorb recharge before the next discharge. This information conditions the operation of the systems using batteries.

During the life of a battery, its performances tend to degrade gradually because of the physical and chemical variations that occur while it is being used, until it becomes unusable. The SoH represents the state of wear of a battery. This parameter corresponds to the total capacity of a battery at a time t during its life, and it is expressed in percentage of the total capacity determined at the life start, which is equivalent to the nominal capacity given by the manufacturer, or to the capacity measured at the life start under given conditions.

Precise and reliable estimation of the SoC and of the SoH, for a vehicle, allows for example prevention of the vehicle supervisor from behaving too cautiously regarding the use of the battery energy potential, or conversely. A wrong diagnosis of the state of charge can lead to an overestimation of the number of kilometers that can be traveled and put the motorist in a difficult position. Good estimation of these indicators allows avoiding battery safety oversizing, thus allowing saving weight on board, and consequently consumption of fuel. SoC and SoH estimation also allows reduction of the total cost of the vehicle. A correct SoC and SoH diagnosis tool thus guarantees efficient, reliable and perennial battery capacity management over the entire operating range of the vehicle.

Several methods for estimating the SoC and the SoH of a battery are known.

There are for example the known coulomb-counting or book-keeping methods. These methods however lead to estimation of errors by disregarding phenomena such as self-discharge. There is also a known method wherein the no-load voltage is measured as the SoC indicator. Using other indicators, such as the estimation of an internal resistance for example U.S. Pat. No. 6,191,590 B1 and EP Patent 1,835,297 A1, is also a known method.

These two methods are characterized by the fact that the SoC is first associated with one or more measurable or easily estimable quantities (potential, internal resistance), through static maps or analytical functional dependencies. However, these dependencies are in reality much more complicated than what is normally taken into account in the BMS, which often leads to SoC estimation errors.

Another approach is based on mathematical battery models using estimation techniques known in other spheres. U.S. published patent application 2007/0,035,307 A1 notably describes a method of estimating the variables of state and the parameters of a battery from service data (voltage U, current I, T), using a mathematical battery model. The mathematical model comprises a plurality of mathematical sub-models and allows faster response. The sub-models are models of equivalent electrical circuit type, referred to as RC models, associated with restricted frequency ranges.

A potentially more promising method is based on the measurement, by impedance spectroscopy (EIS), of a quantity parametrized by the SoC. For example, U.S. published patent application 2007/0,090,843 determines by EIS the frequency $f_\pm$ associated with the capacitive/inductive transition. A correlation between frequency $f_\pm$ and the SoC is presented for a lead battery, as well as for Ni—Cd and Ni-MH batteries. A similar approach is based on the modelling of the EIS spectra by equivalent electrical circuits, whose components are parametrized by the SoC, as described in U.S. Pat. No. 6,778,913 B2, which allow development of an automotive battery tester Spectro CA-12 (Cadex Electronics Inc., Canada) based on the multi-frequency electrochemical impedance spectroscopy for the acid-lead pair. The EIS spectra are approximated by equivalent electrical circuits and the evolution of the components is parametrized by the SoC. Similarly, in U.S. Pat. No. 6,037,777, the state of charge and other battery properties are determined by measuring the real and imaginary parts of the complex impedance/admittance for lead batteries or other systems. The use of RC models is also described in EP 880,710, the description of the electrochemical and physical phenomena at the electrodes and in the electrolyte serving as a support for the development of the RC model, the temperature of the battery being simulated by the model, in order to increase in precision, in relation to an external measurement.

Concerning the SoH estimation methods known in the literature, in WO 2009/036,444, the authors introduce a reference electrode in commercial elements in order to observe the degradation reactions of the electrodes. This method however requires much instrumentation, notably for inserting a reference electrode in the element, and more complex electronic management of the battery.

French Patent 2,874,701 describes a method using a temporal electric perturbation in order to compare the response obtained with a reference response. However, this method is more difficult to implement for Li-ion type elements whose response variations after this type of perturbation are very low and can therefore not allow precise SoH measurement.

Impedance analyses have also been described in the literature. U. Tröltzsch et al. (Electrochimica Acta 51, 2006, 1664-1672) describe a method wherein they use impedance spectroscopy coupled with the adjustment of impedances according to an electrical model so as to obtain the state of health of the element. This technique however requires stopping using the element for the measurement.

The invention thus is an alternative method of estimating an internal state of an electrochemical system for electrical power storage, such as a battery, without modelling by an equivalent electrical circuit. The method is directly based on an electrochemical impedance model allowing defining this impedance as a function of the SoC for example, and parameters. These parameters are calibrated by an adjustment on electrochemical impedance measurements obtained beforehand for different internal states.

SUMMARY OF THE INVENTION

The invention relates to a method of estimating an internal state of at least a first electrochemical system for electrical power storage, wherein at least one property relative to the internal state of the first electrochemical system is estimated from electrochemical impedance measurements, comprising the following stages:

carrying out testing in a laboratory for differing internal states of at least a second electrochemical system of the same type as the first electrochemical system:—measuring a property relative to the internal state of the second system and measuring the electrochemical impedance of the second electrochemical system at least at one frequency;

defining in a computer programmed with software which, when executed, provides an electrochemical impedance model as a function of the property and of parameters, and calibrating the parameters by an adjustment on the electrochemical impedance measurements obtained for the internal states;

determining an electrochemical impedance Z of the first electrochemical system for at least one frequency, and estimating the internal state of the first electrochemical system by estimating the property relative to the internal state of the electrochemical system using the model and the electrochemical impedance Z.

According to the invention, the property relative to the internal state of the electrochemical system can be estimated by the following:
i. selecting an initial value for the property;
ii. applying the model to the initial value for modelling an electrochemical impedance Zm of the first system for at least one frequency;
iii. adjusting the value so that the modelled electrochemical impedance Zm corresponds to the measured electrochemical impedance Z.

According to the invention, the electrochemical impedance model can be constructed by carrying out the following:
i. selecting a representative impedance diagram curve shape obtained on an electrochemical system of the same type as the first electrochemical system;
ii. defining the model by a formula allowing reproduction of the curve shape.

A model of the type as follows can be used:

$$Zm = a * i * \omega + b + \sum_{k=1}^{k=x} \frac{1}{c_k + d_k * i * \omega^{n_k}}$$

with:
Zm being the electrochemical impedance
$\omega$ being the frequency
x being the number of semi-circles formed by said curve
a, b, $c_k$, $d_k$ and $n_k$ parameters of the model to be calibrated, depending on the property relative to the internal state of the first electrochemical system.

The differing internal states can be obtained through accelerated aging of a second electrochemical system for electrical power storage of the same type as the first electrochemical system. These differing internal states can also be obtained by selecting a set of second electrochemical systems of the same type as the first electrochemical system with the systems of the set having different internal states.

According to the invention, at least one of the properties relative to the internal state of the electrochemical system can be calculated with a SoC of the system, a SoH of the system.

The electrochemical impedance can be determined for various frequencies by measuring electrical impedance diagrams obtained by adding an electrical signal to a current running through the electrochemical system. The electrical impedance diagrams can therefore be measured by applying a sinusoidal current perturbation to the electrochemical system and by measuring an induced sinusoidal voltage at the terminals of the electrochemical system. It is also possible to measure the electrical impedance diagrams by applying a current perturbation in form of a superposition of several sinusoids or in form of a white noise, on the electrochemical system, and by measuring an induced sinusoidal voltage at the terminals of the electrochemical system. Finally, the electrochemical impedance can also be determined for several frequencies by measuring electrical impedance diagrams obtained using a non-invasive method comprising processing the voltage signal and the current signal as a function of time.

According to the invention, the electrochemical system can be at rest or in operation, and the electrochemical system can be a battery or an element of a pack.

According to the invention, it is possible to detect a failure of at least one element of a battery pack by determining the state of function (SoF) of at least one element of the pack.

The invention also relates to a system of estimating an internal state of an electrochemical system for electrical power storage, comprising:

at least one detector including a means for measuring or estimating the electrochemical impedance of the electrochemical system;

a memory for storage of software which, when executed by a computer, provides an electrochemical impedance model as a function of the property, the model being first calibrated by measurements for various internal states of at least a second electrochemical system of the same type as the electrochemical system;

means for calculating a property relative to the internal state of the electrochemical system using the model.

The invention also relates to a smart battery management or charge/discharge system comprising a system for estimating an internal state of the battery according to the invention.

BRIEF DESCRIPTION OF THE DRAWINGS

Other features and advantages of the method and of the systems according to the invention will be clear from reading the description hereafter of embodiments given by way of non-limitative examples, with reference to the accompanying figures wherein:

FIG. 7 shows, in Bode representation, an impedance spectrum obtained from experimental measurements on a commercial battery of $C_6$/LiFePO$_4$ type, superimposed on the prediction values of the adjustment performed according to a mathematical model;

FIG. 8A shows a parameter (d2) obtained through impedance adjustment according to a mathematical model for all the SoCs;

FIG. 8B shows parameter (d2) as a function of the SoC (circles), and the prediction of this value according to a polynomial of degree 7 (line);

DETAILED DESCRIPTION OF THE INVENTION

The method according to the invention allows determining the SoC or the SoH of a battery or of a cell of a pack, of previously identified model and technology, for use in a transport application (traction battery) or for renewable energy storage. The method strengthens the SoC and SoH estimations achieved by the BMS, since these data are not directly measurable.

The method is implemented on board a vehicle or used for energy storage within the context of intermittent power production systems connected to the network, allowing quantitative determination of the SoC and the SoH of batteries, notably Li-ion batteries, from a non-invasive and controlled-temperature measurement of the electrical impedance at the terminals of the electrodes of the system.

Figure 1:
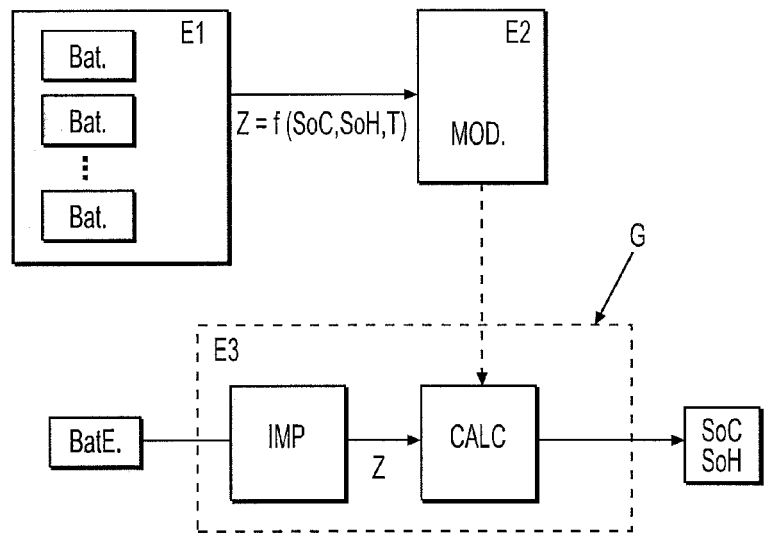
FIG. 1 shows a flow chart of the method according to the invention applied to a battery.

The flow chart of the method is shown in FIG. 1. The method according to the invention comprises the following:

Stage E1: a laboratory test campaign is carried out on a set of batteries (Bat.) in order to measure the electrical impedance (Z) as a function of the frequency, of the SoC, of the SoH and of T.

Stage E2: A model (mod.) of impedance Z is defined and calibrated.

Stage E3: The defined and calibrated model is used in a system (G) in order to estimate the internal state of a battery (BatE) of same technology and model as those of stage E1. The system comprises in particular a device (IMP) for determining the impedance and a computing unit (CALC) programmed with software which, when executed, implements the model mod.

These stages are described in detail in the paragraphs below.

E1—Measuring Electrochemical Impedance Diagrams as a Function of SoC, SoH and T

Figure 2:
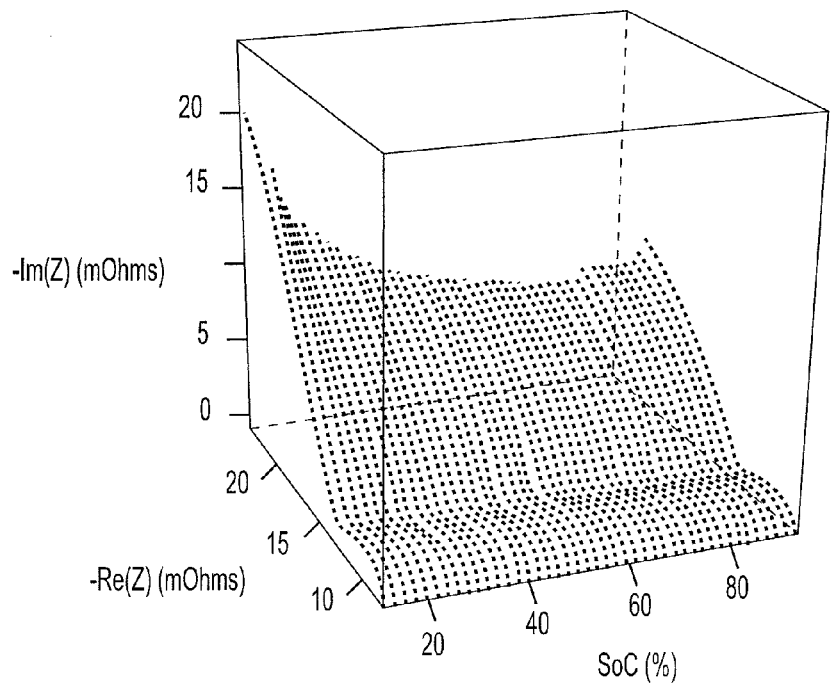
FIG. 2 illustrates impedance diagrams for different SoC values.

A laboratory test campaign is carried out which allows measurement of the electrochemical impedance (Z) as a function of the frequency, the SoC, the SoH and optionally temperature T. Electrochemical impedance diagrams (Z) as a function of SoC (FIG. 2), SoH and/or T are thus obtained. The axes of FIG. 2 represent: the imaginary part of the impedance, Im(Z), expressed in mOhms with the real part of the impedance, Re(Z), expressed in mOhms and the state of charge with SoC, expressed in %.

Generally, differing internal states are utilized of at least a second electrochemical system of the same type as the electrochemical system being studied. The property relative to the internal state of the second system SoC and SoH is measured and the electrical response of the second electrochemical system is measured at different frequencies.

According to an embodiment, for a given type of battery (BatE), and for a given application of this battery, a battery of the same type (Bat.) is used. Electrical response measurements are then performed for various states of charge and of health of this battery. An accelerated aging representative of the chosen application can be performed to obtain different states of health for this battery. For example, the battery is subjected, in the laboratory, to an accelerated aging protocol simulating a vehicle type on-board application.

The impedance diagram measurement can be obtained by applying a (preferably) current sinusoidal perturbation to a battery by a galvanostat and by measuring the sinusoidal voltage induced at the terminals. According to another embodiment, the perturbation can be applied as a superposition of several sinusoids or even in form of a white noise (where all the frequencies are superimposed in the same signal), rather than in form of a simple sinusoidal perturbation, which then allows analysis of many or all of the frequency responses at the same time.

Measurement of the impedance diagrams as a function of the SoC can be done over the whole SoC range or in the SoC range corresponding to the range used for the application.

The variations of the impedance diagrams with the temperature in the operating temperature range of the application can also be measured.

At each state of charge and/or of aging, electrical impedance Z of the electrochemical system is measured by applying a current perturbation by a galvanostat.

Complex quantity Z (of real part ReZ and of imaginary part ImZ) can be represented in a Nyquist diagram, where Im(Z) is a function of ReZ, and where each point corresponds to a frequency. Such a diagram is illustrated in FIG. 2 as a function of the SoC and in FIG. 3. The responses of the fast phenomena (internal resistance to high frequencies), of the intermediate phenomena such as the reactions at the electrodes, and of the slow phenomena (ion diffusion in the low-frequency medium expressed by a Warburg impedance) are thus distinguished. These phenomena are more or less sensitive to the SoCs and SoHs. Thus, the impedance response changes as a function of the state of charge and of aging. One difficulty is to decouple the effects.

The use of a second battery of the same type as the battery being studied has been described. It is also possible to use a set of batteries of the same type with each one of these batteries having a different state of charge and/or state of health.

E2—Defining an Impedance Diagram Model

In this stage, a mathematical formula allowing modelling the impedance as a function of frequency ($\omega$) for a given state of charge SoC, a given state of health SoH and optionally a given temperature is defined. The modelling comprises:

i. selecting an impedance diagram (Z) for a predetermined SoC to determine the shape of the curve representing the diagram, ii. defining a mathematical formula and the model for reproducing this curve shape, and iii. calibrating the parameters of the model to adjust the model in impedance diagrams obtained from measurements.

Figure 3:
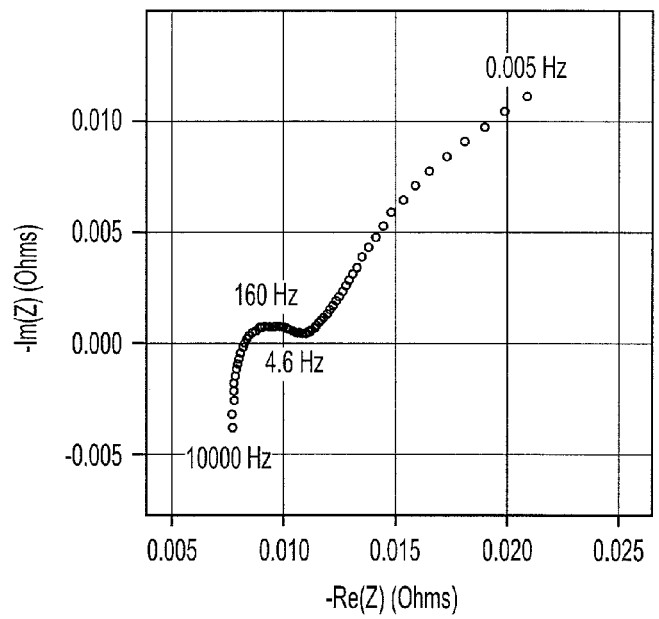
FIG. 3 illustrates an impedance diagram (Nyquist diagram) for a battery whose SoC is around 50%.

An impedance diagram is selected for a predetermined SoC, at a given T. For example, FIG. 3 illustrates an impedance diagram for a battery whose SoC is around 50%. The shape of the curve of this diagram is characteristic of the impedance diagram of a battery. Indeed, an impedance diagram forms a curve comprising at least one semi-circle.

Such a curve can be modelled by the formula as follows:

$$Z(\omega, SoC, SoH, T) = a*i*\omega + b + \sum_{k=1}^{k=x} \frac{1}{c_k + d_k * i * \omega^{n_k}}$$

with: Z being the impedance, ω being the frequency, x being the number of semi-circles observed, and a, b, $c_k$, $d_k$ and $n_k$ being the parameters of the model. If there are three circles, the model comprises 1+1+3+3+3=11 parameters. All the parameters are functions of the SoC, possibly of the SoH and of temperature T, or even of other variables v such as the composition of the element (electrode materials, electrolyte, etc.). Thus, in general, a parameter of the model is denoted by p, and w:

p=f(SoC,SoH,T,v) where f is, for example, a polynomial function.

The electrical impedance model is then calibrated on each impedance diagram of the test campaign corresponding to each state SoC, SoH and temperature (T) of the battery. Calibration assigns a value to the parameters a, b, $c_k$, $d_k$ and $n_k$.

The parameters are calibrated by non-linear regression from a NL2S (Non Linear Least Square) type algorithm. This algorithm allows minimizing of the difference between the prediction of the model and the experimental measurements by varying the adjustment parameters.

E3—Estimating the Internal State of the Electrochemical System Using the Relation The electrical impedance of the electrochemical system under study is determined for different frequencies. Electrical impedance diagrams are therefore measured using one of the following methods:

measuring electrical impedance diagrams by adding an electrical signal to a current running through the electrochemical system:
by applying a sinusoidal current perturbation to the electrochemical system and by measuring an induced sinusoidal voltage at the terminals of the electrochemical system, or
by applying a current perturbation in form of a superposition of several sinusoids or in form of a white noise, on the electrochemical system, and by measuring an induced sinusoidal voltage at the terminals of the electrochemical system.

A free or operating current signal processing is used for the electrochemical system. The method described in French patent application Ser. No. 10/00,778 can be used. It is a non-invasive method of determining the electrical impedance of an electrochemical system without superimposing additional signals. According to this method, the voltage and the current are measured at the terminals of the system as a function of time, and these measurements are converted to frequency signals. At least one segmentation of these frequency signals into several segments is then carried out. For each segment, the power spectral density of the current signal ψI and the cross power spectral density of the voltage and current signals ψIV are determined on each one of the segments. Finally, the electrical impedance of the electrochemical system is determined by calculating the ratio of the mean of the power spectral densities ψI to the mean of the cross power spectral densities ψIV.

An initial value of SoC, and possibly a value of SoH and of T are then selected.

Then, by applying the electrical impedance model constructed in stage 2 to the initial value(s), the modelled impedance and the determined impedance are compared on a diagram. The initial values of parameters (SoC, SoH, T) are then adjusted until the modelled impedance diagram corresponds to the measured impedance diagram.

An optimization algorithm such as the NL2S (Non Linear Least Square) algorithm can be used, whose principle is to minimize the sum of the squares of the differences between measurement and model.

In this algorithm, the difference between the modelled impedance diagram and the measured impedance diagram can be calculated as follows:

$$S = \sum_{i=1}^{N} (Y_i - Ycalc_i)^2$$

S is the sum of the squares of the differences to be minimized; Y is a vector of size N made up of all the measurements to be adjusted; Ycalc is a vector of size N made up of all the predicted measurements.

The value(s) thus determined by the optimization process make up an estimation of the internal state of the electrochemical system.

According to the invention, the model obtained in the previous stage is used in a system for estimating the internal state of an electrochemical system for electric power storage, comprising:

at least one detector (G) including means for measuring or estimating the electrochemical impedance of the electrochemical system. This impedance measuring system (IMP) can also use a method described in stage 1. This impedance measuring system can be replaced by an impedance estimation system such as the system described in French patent application Ser. No. 10/00,778;

a memory allowing storage of an electrochemical impedance model as a function of the property with the model first being calibrated by measurements for various internal states, software (CALC) comprising:
means for calculating the impedance if it is not integrated in the measuring system; and
means, such as an optimizer (OPT), for calculating the property relative to the internal state of the electrochemical system by the model.

The invention also relates to a smart battery management system comprising a system of estimating an internal state of the battery or of an element as described above.

This smart management system can be a battery charge or discharge system.

Additional Embodiments

According to an embodiment, the electrochemical impedances are measured for only a single frequency (not several). This frequency is preferably selected in the lower frequencies.

Figure 4:
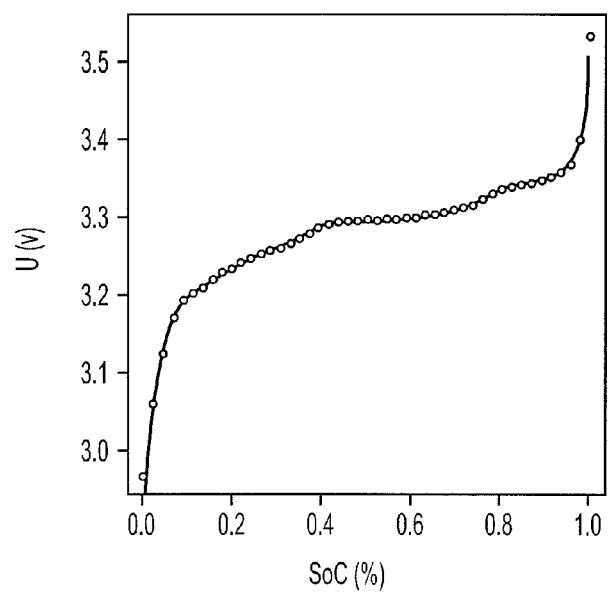
FIG. 4 illustrates voltage U (in V) as a function of the normed capacity of charge SoC.

According to another embodiment, other variables with a (low) evolution as a function of the SoC are used. The voltage at the battery terminals is advantageously used. FIG. 4 illustrates the voltage U (in V) as a function of the normed charge capacity SoC. The points represent measurements. The curve represents an adjustment of a polynomial type. It is also possible to adjust these measurement points by a thermodynamic equation of Redlich-Kister or Margoules type.

An equation of U=f(SoC, T) type is thus obtained.

According to this embodiment, the parameters of the impedance diagram model are determined by solving the following system:

$$\begin{cases} Z = a*i*w + b + \dfrac{1}{c_1 + d_1*i*w^{n_1}} + \dfrac{1}{c_2(SoC, T) + d_2(SoC, T)*i*w^{n_2}} \\ U = f(SoC, T) \end{cases}$$

An algorithm of NL2S type (Non Linear Least Square) can be used to solve this system.

Figure 5A:
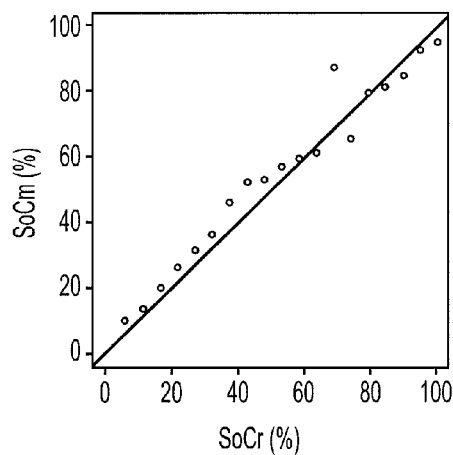
FIG. 5A illustrates SoC values, measured (SoCr), as a function of the SoC values (SoCm) modelled by solving the impedance equation.
Figure 5B:
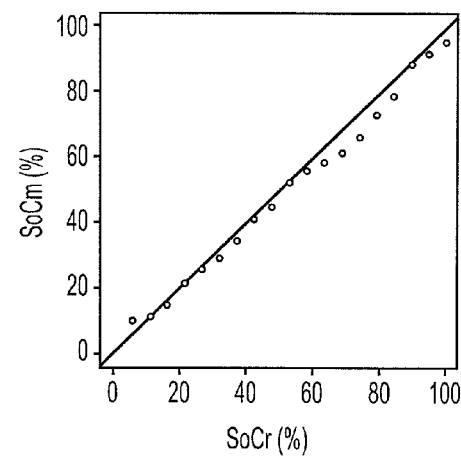
FIG. 5B illustrates SoC values really measured (SoCr) as a function of the SoC values (SoCm) modelled by solving the impedance equation and the voltage equation.

FIGS. 5A and 5B illustrate the advantage of this embodiment. FIG. 5A illustrates SoC values really measured (SoCr) as a function of SoC values (SoCm) modelled by solving the impedance equation. FIG. 5B illustrates SoC values really measured (SoCr) as a function of SoC values (SoCm) modelled by solving the impedance equation and the voltage equation. A better adjustment is observed in FIG. 5B.

Thus, the method according to the invention allows obtaining a reliable tool for determining the state of charge or the state of health of a Li-ion element. This method is applicable to all technologies, and the parameters of the model that can vary as a function of dispersion are included in the calculation (and not rigidly set). Finally, according to this method, it is possible to account for the temperature and of any parameter likely to influence the impedance response of the battery.

By way of example, the stages of the method according to the invention are applied to two different Li-ion battery or accumulator technologies: a LFP/C technology (LFP designating a positive electrode based on iron phosphate, C a negative electrode based on graphite) and a NCO/C technology (NCO designating a positive electrode based on nickel).

Example 1

Case of an Element of Chemical Composition LFP/C

Stage 1

Figure 6:
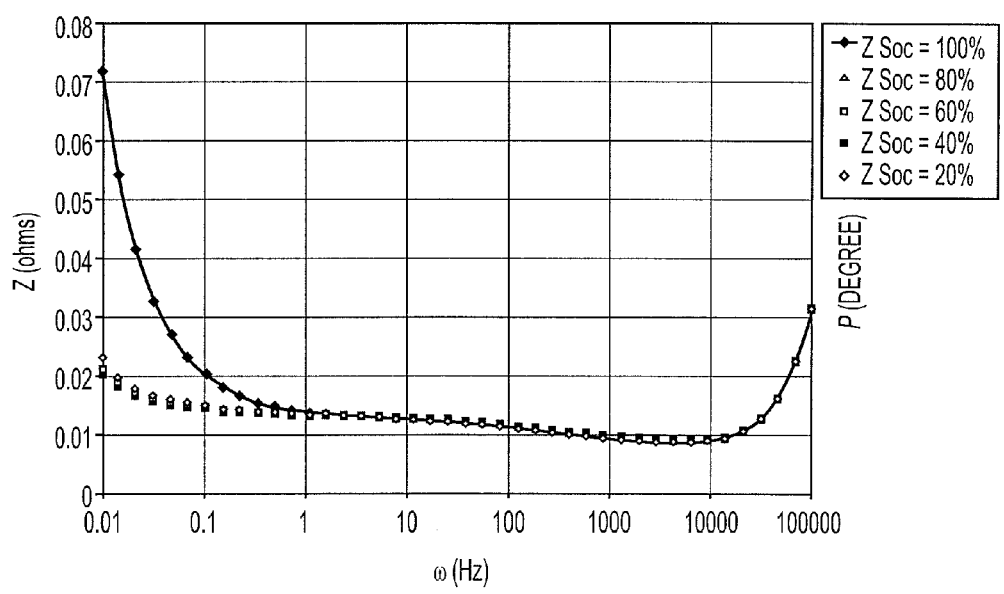
FIG. 6 shows, in Bode representation, a comparison between the impedances obtained for several states of charge at a temperature of 25° C., for a commercial battery of $C_6$/LiFePO$_4$ type.

FIG. 6 illustrates a Bode diagram wherein ω represents the frequency in Hz, P represents the phase in degrees and Z represents the electrochemical impedance modulus in Ohms. This diagram allows comparison of the impedances determined for states of charge on a C/LFP type battery. These impedances were obtained using successively sinusoidal signals of different frequencies. The impedances can also be obtained differently, for example by superposing a white noise on the battery charge/discharge signals.

It should be noted that, in the diagram, the impedances are not superimposed and that they evolve as a function of the charged capacity.

Stage 2

These differences are quantified according to the invention by adjusting an impedance model on the curves of the impedance diagram by means of the formula as follows:

$$Z(\omega, SoC) = a*i*\omega + b + \dfrac{1}{c_1 + d_1*i*\omega^{n_1}} + \dfrac{1}{c_2 + d_2*i*\omega^{n_2}}$$

where a, b, c1, d1, n1, c2, d2 and n2 are parameters to be adjusted according to the experimental values.

The adjustment quality can be tested with a Nyquist or a Bode diagram for a SoC and a temperature. In FIG. 7, the triangles (phase denoted by P) and the diamonds (impedance modulus denoted by Z) represent the experimental values, and the full lines represent the adjusted values. It should be noted that the predictions and the measurements are all superimposed, which indicates an adjustment with a well-selected model, and properly estimated parameters.

After systematic adjustment of all the impedances experimentally determined as a function of the SoC and of T, only parameters c2, d2 and n2 relative to the second semi-circle evolve as a function of the SoC. The SoC dependence is illustrated in FIG. 8A for parameter d2. A polynomial function is used to adjust the SoC dependence of the parameters. In the case of d2, an adjustment with a polynomial of degree 7 allows obtaining an equation following the path shown in FIG. 8B. The other parameters can be taken constant whatever the state of charge of the battery.

In the end, all the adjustments performed as a function of the SoC allow obtaining a model predicting the impedance of a battery as a function of the perturbation frequency and of the SoC.

Stage 3

A battery of same technology and model is considered as those tested in stages 1 and 2, of known SoC. Its electrical impedance is determined through measurement as described in stages 1 and 2, or according to the method described in French patent application Ser. No. 10/00,778. The optimization algorithm based on the model according to the invention allows estimation of the SoC of the battery from the experimental measurements (example on the validation battery, FIG. 5A).

Advantageously, the voltage of the element as a function of the SoC (FIG. 4) can be used to obtain a higher precision on the SoC (example on the validation battery, FIG. 5B).

Example 2

Case of an Element of Chemical Composition NCO/C

Figure 9:
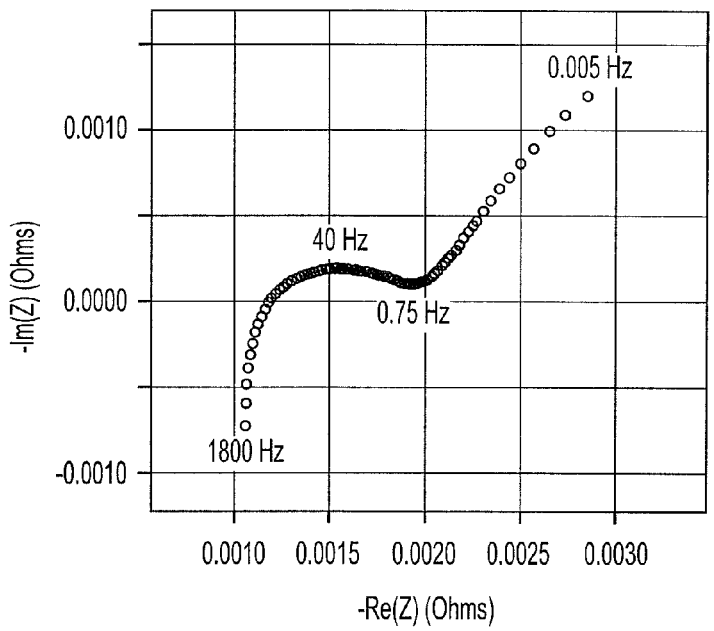
FIG. 9 illustrates another impedance diagram (Nyquist diagram) for a battery whose SoC is around 50%.

This new example allows testing the robustness of the method according to the invention for various battery technologies. The impedance diagram (Nyquist diagram) with 50% SoC of the NCO/C technology is shown in FIG. 9. The shape of this curve suggests the convolution of 3 semi-circles, which allows defining the model as follows:

$$Z(\omega, SoC) = a*i*\omega + b + \dfrac{1}{c_1 + d_1*i*\omega^{n_1}} + \dfrac{1}{c_2 + d_2*i*\omega^{n_2}} + \dfrac{1}{c_3 + d_3*i*\omega^{n_3}}$$

where a, b, c1, d1, n1, c2, d2, n2, c3, d3 and n3 are parameters to be adjusted according to the experimental values.

By proceeding as in the previous example, this model is adjusted on the impedance diagrams as a function of the frequency, the state of charge and the temperature, and leads to an impedance model as a function of the SoC, the temperature and the frequency.

Figure 10:
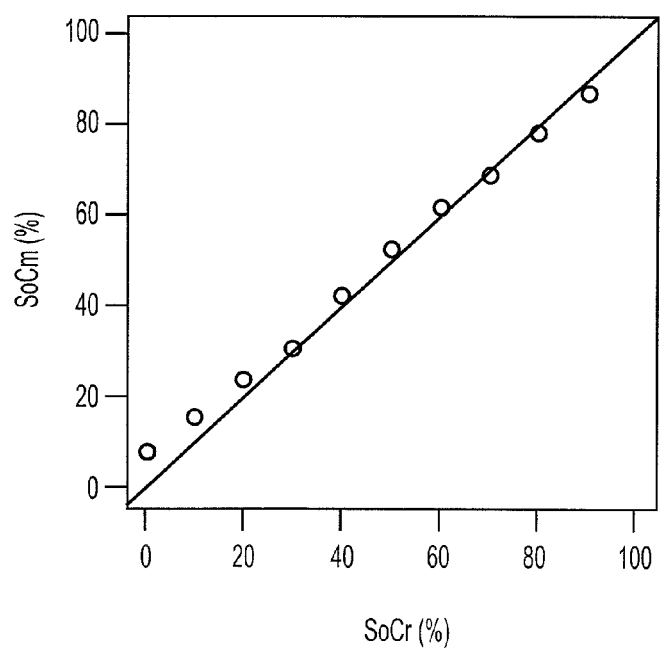
FIG. 10 illustrates SoC values really measured (SoCr) as a function of the SoC values (SoCm) modelled by a model according to the invention.

Using another element of identical chemical composition, of known SoC, and the previous model, it is possible to calculate the SoC of this element from a determination of its electrical impedance at a given T. FIG. 10 illustrates the results which are the SoC values actually measured (SoCr) as a function of the SoC values (SoCm) modelled by the model.

It appears that the SoC values determined using the method according to the invention are very close to the real SoC.

Figure 11:
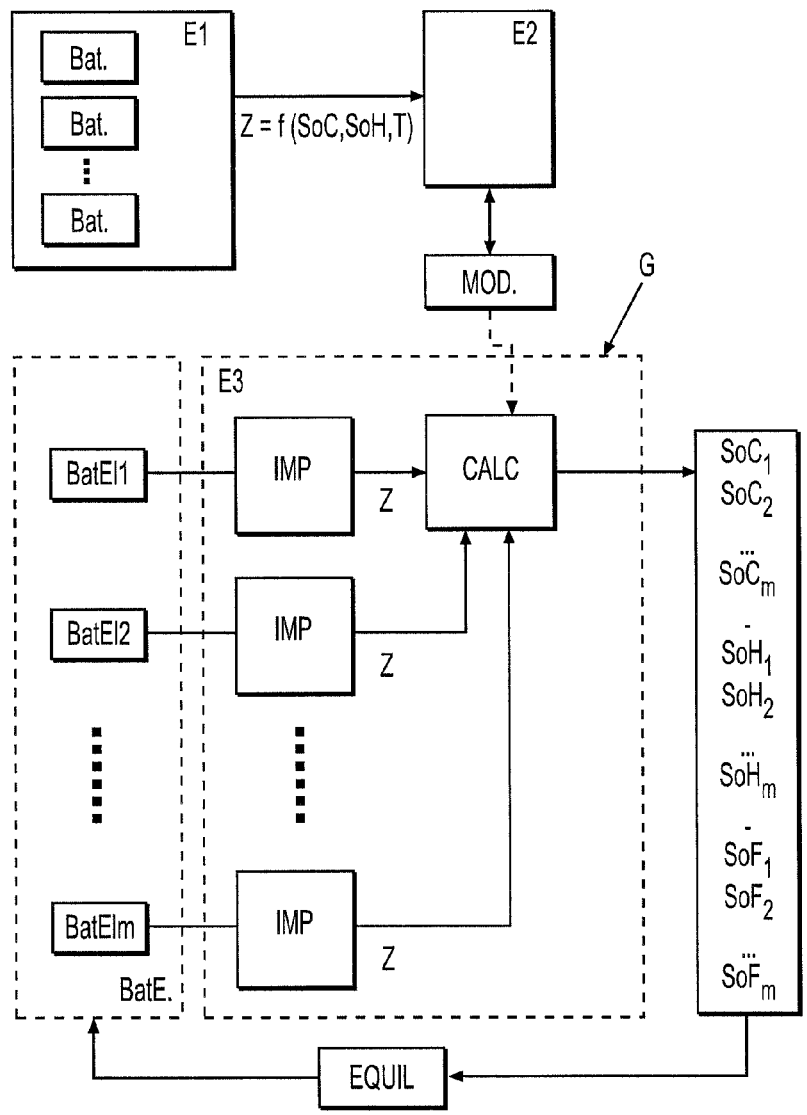
FIG. 11 shows the flow chart of the method according to the invention applied to several elements of a battery.

The invention has been described within the type of a battery making up a pack of the cells. The electrochemical system can be an element of a pack without departing from the scope of the invention. See FIG. 11, where BatEl represents an element of pack BatE, and where index 1, 2, ... m respectively refers to element number 1, 2, ... m.

In fact, the existing indicators of the internal state of the cells are based on current, voltage and skin temperature measurements obtained on each element of the pack.

In order to achieve finer management of the performances of a Li-ion pack, to increase its life and to anticipate its defects, it may be necessary to also diagnose the state of a Li-ion battery pack on board a vehicle individually on the scale of each element or of some well-selected elements.

Precise knowledge of the state of charge (SoC) of each element, according to the method of the invention, allows better balance (EQUIL in FIG. 11) of the pack, knowing that the weakest cell is limiting. Moreover, it is from the SoC that the power available any time is calculated in the BMS.

Estimation of the SoH of each element, according to the method of the invention, also contributes to a better pack balance, hence an increased life. The indicator gives the residual capacity of the battery in relation to the charged state at a time t which allows designing without oversizing the initial pack, or under-using it.

Detecting a failure of an element (SoF state of function), according to the method of the invention, allows switching to a degraded mode of operation by putting the defective module out of service, rather than reaching a dysfunction leading to a stoppage or a degradation of the battery.

The invention claimed is:

1. A method of estimating an internal state of at least a first electrochemical system for electrical power storage, wherein at least one property relative to the internal state of the first electrochemical system is estimated from electrochemical impedance measurements, comprising:
   carrying out testing in a laboratory of differing internal states of at least a second electrochemical system of a same type as the first electrochemical system by measuring the at least one property relative to the internal state of the second system and measuring the electrochemical impedance of the second electrochemical system at least at one frequency;
   defining an electrochemical impedance model in a computer programmed with software, which when executed, provides the electrochemical impedance model as a function of the at least one property and of parameters, and calibrating the parameters by an adjustment of the electrochemical impedance measurements obtained for the internal states;
   determining an electrochemical impedance Z of the at least the first electrochemical system for at least one frequency, and
   estimating the internal state of the at least the first electrochemical system by estimating the property relative to the internal state of the second electrochemical system using the model and the electrochemical impedance Z.

2. A method as claimed in claim 1, wherein the property relative to the internal state of the second electrochemical system is estimated by:
   i. selecting an initial value for the property;
   ii. applying the model to the initial value for modelling an electrochemical impedance Zm of the first system for at least one frequency;
   iii. adjusting the value so that the modelled electrochemical impedance Zm corresponds to the measured electrochemical impedance Z.

3. A method as claimed in claim 2, wherein the various internal states are obtained by accelerated aging of the second electrochemical system for electrical power storage of the same type as the first electrochemical system.

4. A method as claimed in claim 2, wherein the internal states are obtained by selecting a set of second electrochemical systems of a same type as the first electrochemical system with the systems of the set having different internal states.

5. A method as claimed in claim 2, wherein at least one of the properties relative to the internal state of the second electrochemical system is calculated as a state of charge (SoC) of the second system and a state of health (SoH) of the second system.

6. A method as claimed in claim 2, wherein the electrochemical impedance is determined for frequencies by measuring electrical impedance diagrams obtained by adding an electrical signal to a current running through the second electrochemical system.

7. A method as claimed in claim 1, wherein the electrochemical impedance model is constructed by:
   i. selecting a representative impedance diagram curve shape obtained from an electrochemical system of a same type as the first electrochemical system; and
   ii. defining the model by a formula allowing reproduction of the curve shape.

8. A method as claimed in claim 7, wherein a model of the type as follows is used:

$$Zm = a*i*\omega + b + \sum_{k=1}^{k=x} \frac{1}{c_k + d_k*i*\omega^{n_k}}$$

with:
Zm being electrochemical impedance
$\omega$ being frequency
x being a number of semi-circles formed by the curve
a, b, $c_k$, $d_k$ and $n_k$ are parameters of the model to be calibrated, depending on the property relative to the internal state of the first electrochemical system.

9. A method as claimed in claim 8, wherein the various internal states are obtained by accelerated aging of the second electrochemical system for electrical power storage of the same type as the first electrochemical system.

10. A method as claimed in claim 9, wherein at least one of the properties relative to the internal state of the second electrochemical system is calculated as a state of charge (SoC) of the second system and a state of health (SoH) of the second system.

11. A method as claimed in claim 9, wherein the electrochemical impedance is determined for frequencies by measuring electrical impedance diagrams obtained by adding an electrical signal to a current running through the second electrochemical system.

12. A method as claimed in claim 8, wherein the electrochemical impedance is determined for frequencies by measuring electrical impedance diagrams obtained by adding an electrical signal to a current running through the second electrochemical system.

13. A method as claimed in claim 7, wherein a model of the type as follows is used:

$$Zm = a*i*\omega + b + \sum_{k=1}^{k=x} \frac{1}{c_k + d_k * i * \omega^{n_k}}$$

with:

Zm being electrochemical impedance

ω being frequency x being a number of semi-circles formed by the curve a, b, ck, dk and nk are parameters of the model to be calibrated, depending on the property relative to the internal state of the first electrochemical system.

14. A method as claimed in claim 13, wherein at least one of the properties relative to the internal state of the second electrochemical system is calculated as a state of charge (SoC) of the second system and a state of health (SoH) of the second system.

15. A method as claimed in claim 7, wherein the various internal states are obtained by accelerated aging of the second electrochemical system for electrical power storage of the same type as the first electrochemical system.

16. A method as claimed in claim 7, wherein the internal states are obtained by selecting a set of second electrochemical systems of a same type as the first electrochemical system with the systems of the set having different internal states.

17. A method as claimed in claim 7, wherein at least one of the properties relative to the internal state of the second electrochemical system is calculated as a state of charge (SoC) of the second system and a state of health (SoH) of the second system.

18. A method as claimed in claim 7, wherein the electrochemical impedance is determined for frequencies by measuring electrical impedance diagrams obtained by adding an electrical signal to a current running through the second electrochemical system.

19. A method as claimed in claim 1, wherein the electrochemical impedance model is constructed by:
 i. selecting a representative impedance diagram curve shape obtained from an electrochemical system of a same type as the first electrochemical system; and
 ii. defining the model by a formula allowing reproduction of the curve shape.

20. A method as claimed in claim 19, wherein the various internal states are obtained by accelerated aging of the second electrochemical system for electrical power storage of the same type as the first electrochemical system.

21. A method as claimed in claim 19, wherein the internal states are obtained by selecting a set of second electrochemical systems of a same type as the first electrochemical system with the systems of the set having different internal states.

22. A method as claimed in claim 21, wherein the electrochemical impedance is determined for frequencies by measuring electrical impedance diagrams obtained by adding an electrical signal to a current running through the second electrochemical system.

23. A method as claimed in claim 1, wherein the various internal states are obtained by accelerated aging of the second electrochemical system for electrical power storage of the same type as the first electrochemical system.

24. A method as claimed in claim 1, wherein the internal states are obtained by selecting a set of second electrochemical systems of a same type as the first electrochemical system with the systems of the set having different internal states.

25. A method as claimed in claim 1, wherein at least one of the properties relative to the internal state of the second electrochemical system is calculated as a state of charge (SoC) of the second system and a state of health (SoH) of the second system.

26. A method as claimed in claim 1, wherein the electrochemical impedance is determined for frequencies by measuring electrical impedance diagrams obtained by adding an electrical signal to a current running through the second electrochemical system.

27. A method as claimed in claim 26, wherein the electrical impedance diagrams are measured by applying a sinusoidal current perturbation to the second electrochemical system and by measuring an induced sinusoidal voltage at the terminals of the second electrochemical system.

28. A method as claimed in claim 26, wherein the electrical impedance diagrams are measured by applying a current perturbation including superposition of sinusoids or of a white noise, to the second electrochemical system, and by measuring an induced sinusoidal voltage at the terminals of the electrochemical system.

29. A method as claimed in claim 1, wherein the electrochemical impedance is determined for frequencies by measuring electric impedance diagrams obtained using a non-invasive method comprising processing a voltage signal and a current signal as a function of time.

30. A method as claimed in claim 1, wherein said electrochemical system is at rest or in operation.

31. A method as claimed in claim 1, wherein the electrochemical system is a battery or an element of a pack.

32. A method as claimed in claim 1, wherein a failure of at least one element of a battery pack is detected by determining the state of function of at least one element of the pack.

33. A system for estimating an internal state of a first electrochemical system for electrical power storage, comprising:
 at least one detector for measuring or estimating the electrochemical impedance of the first electrochemical system;
 a memory for storing software, which when executed by a computer, provides an electrochemical impedance model as a function of at least one property and parameters, the model being first calibrated by measurements in a laboratory of differing internal states of at least a second electrochemical system of a same type as the first electrochemical system; and
 means for calculating the property relative to the internal state of the electrochemical system using the model.

34. A system in accordance with claim 33 for comprising a smart battery management or a charge/discharge system.

* * * * *